United States Patent [19]

Bonhomme

[11] 4,054,742
[45] Oct. 18, 1977

[54] PRINTED CIRCUIT BOARDS

[76] Inventor: François Robert Bonhomme, 6, Parc de Bearn, Saint Cloud, France, 92210

[21] Appl. No.: 671,165

[22] Filed: Mar. 29, 1976

[30] Foreign Application Priority Data

Apr. 11, 1975   France ............................. 75.11314

[51] Int. Cl.² ............................................. H02B 1/02
[52] U.S. Cl. ........................ 174/68.5; 339/176 MP; 361/413
[58] Field of Search ................... 317/101 DH, 101 R; 174/68.5; 339/176 MP, 17 L, 17 LC, 17 LM; 361/413

[56] References Cited
U.S. PATENT DOCUMENTS

| 3,138,675 | 6/1964 | Krons | 339/17 LC |
| 3,278,714 | 10/1966 | Bernutz | 339/176 MP |

Primary Examiner—David Smith, Jr.

[57] ABSTRACT

A printed circuit board comprising, adjacent at least one of its edges and on at least one of its faces, conducting tracks adapted to co-operate with resilient contact members of a connector for receiving the board, the contact members being orientated in use parallel to the tracks, in which at least one of the conducting tracks has a concave cross section and is formed by a cavity in a rigid insulating support forming part of the board or in a male conductor associated with the board, the surface of the cavity having a coating of conducting material.

2 Claims, 3 Drawing Figures

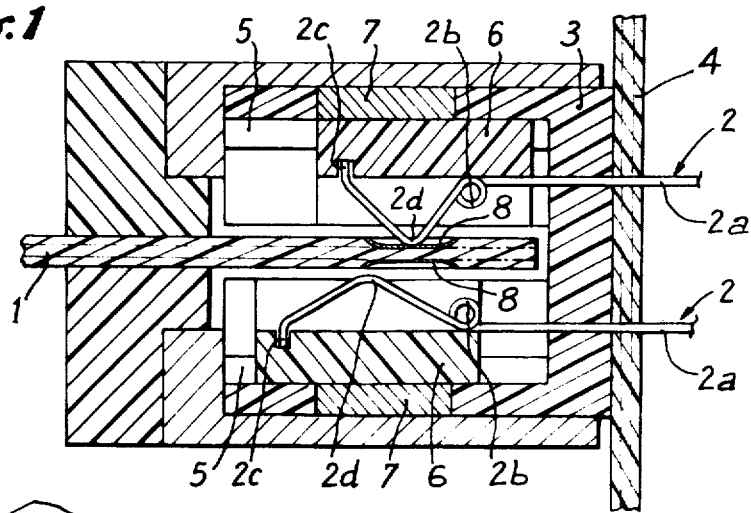
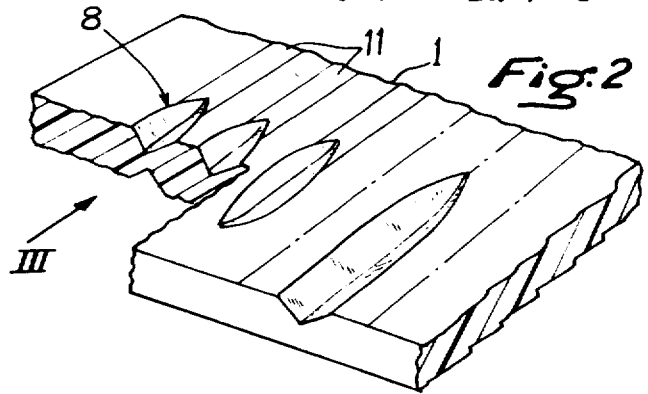
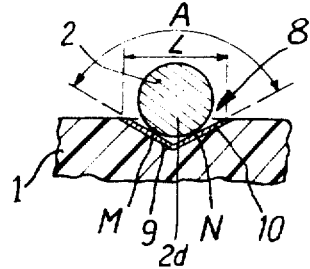

PRINTED CIRCUIT BOARDS

BACKGROUND OF THE INVENTION

This invention relates to printed circuit boards.

FIELD OF THE INVENTION

More particularly, the invention relates to printed circuit boards comprising, adjacent at least one of their edges and on at least one of their faces, conducting tracks adapted to co-operate with resilient contact members of a connector for receiving the boards, the contact members being orientated in use parallel to the tracks. These conducting tracks may be carried either directly by the board, that is to say by a flat insulating rigid support, which may or may not be rectangular and which is generally made of laminated plastics material, or by "male connectors", that is to say by relatively flat rigid elements which are mounted at the edges of the board proper, with or without freedom of movement in a direction parallel to these edges. Such a freedom of movement enables the conducting tracks of the male connectors to be centered with respect to the resilient contact members; the male connectors can be dismounted and replaced when their conducting tracks are worn, while the actual printed circuit boards, which are expensive, remain usable for a long period.

Because of the geometry of the resilient contact members (the cross-section of which is generally round) and that of the conducting tracks of the board (which are generally flat according to the present state of the art), each contact member can generally only touch the conducting track at a single point. The passage of current between the contact members and the tracks is therefore not ensured in a satisfactory and reliable manner.

DESCRIPTION OF PRIOR ART

In order to overcome these disadvantages, it has already been proposed to constitute the connecting tracks by metallic elements added to the printed circuit board and given a concave section. Such elements may consist either of rivets, the head of which is provided with a central groove (as described in British patent specification No. 1,028,146), or of a metal wire folded in such a manner as to have two juxtaposed arms between which the resilient contact members bear (as described in British patent specification No. 1,203,756). These known solutions have various disadvantages. First of all, the added metallic elements have an excessive width which only allows a limited number of conducting tracks to be placed on a board of standard width. Moreover, these elements exceed the height of the board, which renders the storing and the handling of the boards more difficult. Furthermore, their fixing renders it necessary to pierce the boards, which promotes incipient tearing. Finally, it is difficult to orientate appropriately the groove in the rivet heads or to maintain the juxtaposed arms of a folded metal wire in a well-defined lateral position.

SUMMARY OF THE INVENTION

According to the invention, there is provided a printed circuit board comprising, adjacent at least one of its edges and on at least one of its faces, conducting tracks adapted to cooperate with resilient contact members of a connector for receiving the board, the contact members being orientated in use in alignment with the tracks, in which at least one of the conducting tracks has a concave cross section and is formed by a cavity in a rigid insulating support forming part of the board or in a male conductor associated with the board, the surface of the cavity having a coating of conducting material.

Apart from the advantage of a contact at two points or lines between the contact member and the track, such a board has the advantage of centering the resilient contact member in relation to the conducting track.

Moreover, a large number of such conducting tracks can be accommodated on a standard board.

BRIEF DESCRIPTION OF THE DRAWINGS

The invention will now be described, by way of example, with reference to the accompanying drawings, in which FIG. 1 is a fragmentary sectional view of a printed circuit board according to the invention, engaged in a connector provided with resilient contact members, FIG. 2 is a perspective view, on a larger scale, with parts cut away, of an edge portion of the printed circuit board of FIG. 1, and FIG. 3 is a view, on a still larger scale and taken in the direction of the arrow III of FIG. 2, of a conducting track of the printed circuit board with the associated resilient contact member shown in cross section.

DESCRIPTION OF PREFERRED EMBODIMENT

FIG. 1 shows, by way of example, a printed circuit board 1 which is engaged in a connector according to my co-pending patent application U.S. Serial No. 665,864 filed March 11, 1976, entitled "ELECTRICAL CONNECTION DEVICES."

Such a connector comprises a series of contact members 2 which are grouped in pairs, one of these pairs being visible in FIG. 1. Each contact member 2 is formed by a round metal wire and has a rectilinear portion 2a which passes through a U-shaped insulating case 3 and a connecting board 4, called a "mother board". At each side of the mean plane of the board 1, the case 3 has mortises 5 in which are engaged dovetail tenons belonging to two slides 6. By means of two sliding strips 7, which can be displaced jointly perpendicular to the plane of FIG. 1, it is possible to cause the slides 6 to pass from the closed position illustrated in the upper part of FIG. 1 to the open position represented in the lower half of the Figure, and vice versa. Between a loop or turn 2b and an end 2c anchored in one of the slides, each contact member 2 has an active region 2d which, according to the position of its slide 6, is applied resiliently against the opposite conducting track 8 of the board 1 (upper part of FIG. 1) or is retracted from the volume swept by the board during its introduction or its extraction (lower part of FIG. 1).

According to the invention, at least one of the conducting tracks 8 has a concave cross section, clearly visible in FIGS. 2 and 3. In order to form such tracks, cavities 9 having a V-shaped section, are machined in the insulating support of the board. As FIG. 2 shows, these cavities 9 have a relatively great length to tolerate a certain inaccuracy in the position (in the direction of this length) of the active region 2d of the contact members 2. In the embodiment illustrated in full lines in FIG. 1 and shown by the three tracks on the left in FIG. 2, the conducting tracks 8 or cavities 9 stop before the edge of the board 1; in an alternative embodiment illustrated in chain line in FIG. 1 and by the right hand track in FIG. 2, the conducting tracks 8 or cavities 9 continue, with a constant section, as far as the edge of the board. The depth of the cavities 9 depends on the thickness of the board 1 and on the diameter of the single wire or of the group of elemental wires (twisted or parallel) forming the contact members 2. The angle A of the V-section (FIG. 3), should be such that it enables the active region 2d of the member 2 to be centered in the bottom of the V solely by the pressure of the member 2 against the board 1. Finally, the width "L" of each V should be sufficiently great in relation to the diameter of the members 2 to enable the member 2 to be accommodated in the center of the V, as a result of its pressing against the board 1, that is to say to ensure the contact between the member 2 and track 8 at two points or lines, despite spacing between the active region 2d of the contact member 2 with respect to the plane of symmetry of the V cavity. In any case, the surfaces of the cavities 9 are metallized to form conducting layers 10 which, outside the region which may be touched by the contact member 2, may be extended by flat conducting elements 11.

As can be seen from FIG. 3, the invention enables the contact member 2 to touch the conducting track 8 tangentially at two points M and N (instead of generally at a single point hitherto), or at two lines passing through these two points.

If a value of the order of 0.4 mm is attributed to the width L of the tracks, for a member 2 consisting of one wire, the diameter of which is between 0.10 and 0.15 mm, a spacing of the order of only 0.6 mm can be provided between adjacent tracks 8, which enables a greater number of tracks 8 to be placed on a standard board 1 than hitherto.

It will be appreciated that the invention is not limited to the embodiments illustrated by the accompanying drawings, and that many modifications will be apparent to those skilled in the art. In particular, the printed circuit boards according to the invention may be used with any connector adapted to receive such boards and the invention is therefore not limited to the case where this connector is of the type described in the above-mentioned co-pending patent application. Moreover, the contact members 2 are not necessarily round but may, in particular, be of square or rectangular section. Furthermore, the concave cross section of the conducting tracks is not necessarily V-shaped but may, for example, have a flat bottom, and oblique, straight, or curved sides, provided that these sides are orientated in such a manner as to restore towards the plane of symmetry of the conducting track any conductor which appears with a certain lateral offsetting.

I claim

1. A printed circuit board comprising, adjacent at least one of its edges and on at least one of its faces, conducting tracks adapted to cooperate with resilient contact members of a connector for receiving the board, the contact members being orientated in use in alignment with the tracks, in which at least one of the conducting tracks has a concave cross section and is formed by a cavity in a rigid insulating support forming part of the board or in a male conductor associated with the board, the surface of the cavity having a coating of conducting material said cavity being of generally V-shaped cross section.

2. Printed circuit board comprising, adjacent at least one of its edges and on at least one of its faces, conducting tracks adapted to cooperate with resilient contact members of a connector for receiving the board, the contact members being orientated in use in alignment with the tracks, in which at least one of the conducting tracks has a concave cross section and is formed by a cavity and a rigid insulating support forming part of the board or in a male conductor associated with the board, the surface of the cavity having a coating of conducting material, said cavity being of generally V-shaped cross section, and in which the or each cavity surface is metallized to form the conducting track.

* * * * *